(12) United States Patent
Kondo et al.

(10) Patent No.: US 11,087,454 B2
(45) Date of Patent: Aug. 10, 2021

(54) DEFECT OBSERVATION DEVICE AND DEFECT OBSERVATION METHOD

(71) Applicant: HITACHI HIGH-TECH CORPORATION, Tokyo (JP)

(72) Inventors: Naoaki Kondo, Tokyo (JP); Minoru Harada, Tokyo (JP); Yuji Takagi, Tokyo (JP); Takehiro Hirai, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 81 days.

(21) Appl. No.: 16/493,697

(22) PCT Filed: Mar. 17, 2017

(86) PCT No.: PCT/JP2017/011018
§ 371 (c)(1),
(2) Date: Sep. 12, 2019

(87) PCT Pub. No.: WO2018/167965
PCT Pub. Date: Sep. 20, 2018

(65) Prior Publication Data
US 2020/0034957 A1    Jan. 30, 2020

(51) Int. Cl.
*G06T 7/00* (2017.01)
*G01N 21/95* (2006.01)
*G01N 21/956* (2006.01)

(52) U.S. Cl.
CPC ......... *G06T 7/001* (2013.01); *G01N 21/9501* (2013.01); *G01N 21/95607* (2013.01);
(Continued)

(58) Field of Classification Search
CPC ........... G06T 7/001; G06T 2207/10061; G06T 2207/30148; G01N 21/9501; G01N 21/95607; H01J 2237/2817
See application file for complete search history.

(56) References Cited

U.S. PATENT DOCUMENTS

| 2002/0006562 A1* | 1/2002 | Akutagawa | G06T 7/001 430/30 |
| 2005/0018899 A1* | 1/2005 | Elyasaf | G06T 7/001 382/145 |

(Continued)

FOREIGN PATENT DOCUMENTS

JP    2001325595    11/2001

*Primary Examiner* — David F Dunphy
(74) *Attorney, Agent, or Firm* — Miles & Stockbridge, P.C.

(57) ABSTRACT

A defect observation device comprising: a defect determination coordinate creation unit by which the coordinates of a plurality of second defect candidates are determined as overlapping defect candidate coordinates, the plurality of second defect candidates respectively having, in a plurality of second imaging visual field regions overlapping a first imaging visual field region, a circuit pattern which partly overlaps a circuit pattern in the first imaging visual field region, in which a first defect candidate for defect determination among a plurality of defect candidates of a sample is present; a pseudo-reference image generation unit which generates a pseudo-reference image including a circuit pattern of the first defect candidate by superimposing a plurality of images respectively captured at the plurality of overlapping defect candidate coordinates; and a defect determination unit which compares an image for defect determination captured at the coordinates of the first defect candidate with the pseudo-reference image to determine the presence or absence of a defect in the image for defect determination.

9 Claims, 13 Drawing Sheets

(52) U.S. Cl.
CPC ......... *G06T 2207/10061* (2013.01); *G06T 2207/30148* (2013.01); *H01J 2237/2817* (2013.01)

(56) References Cited

U.S. PATENT DOCUMENTS

2011/0176719 A1* 7/2011 Inoue ................ G06T 7/001
382/149
2013/0140457 A1* 6/2013 Minekawa ........... G06T 7/0004
250/307
2014/0177792 A1* 6/2014 Barakat ............... G01N 23/083
378/41

* cited by examiner

[FIG. 1]
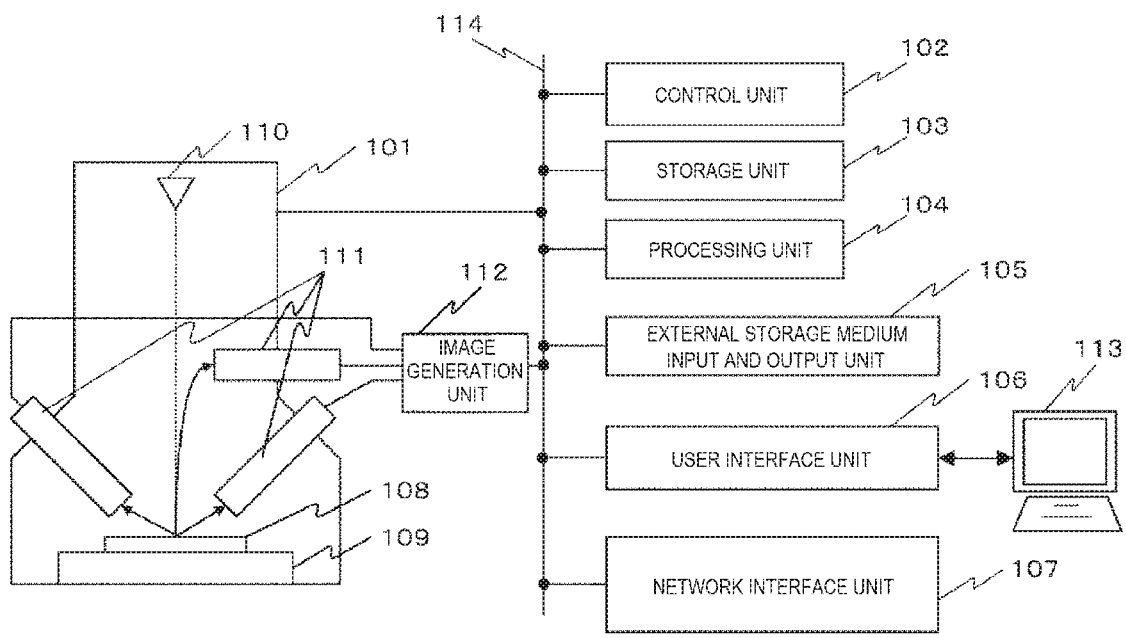

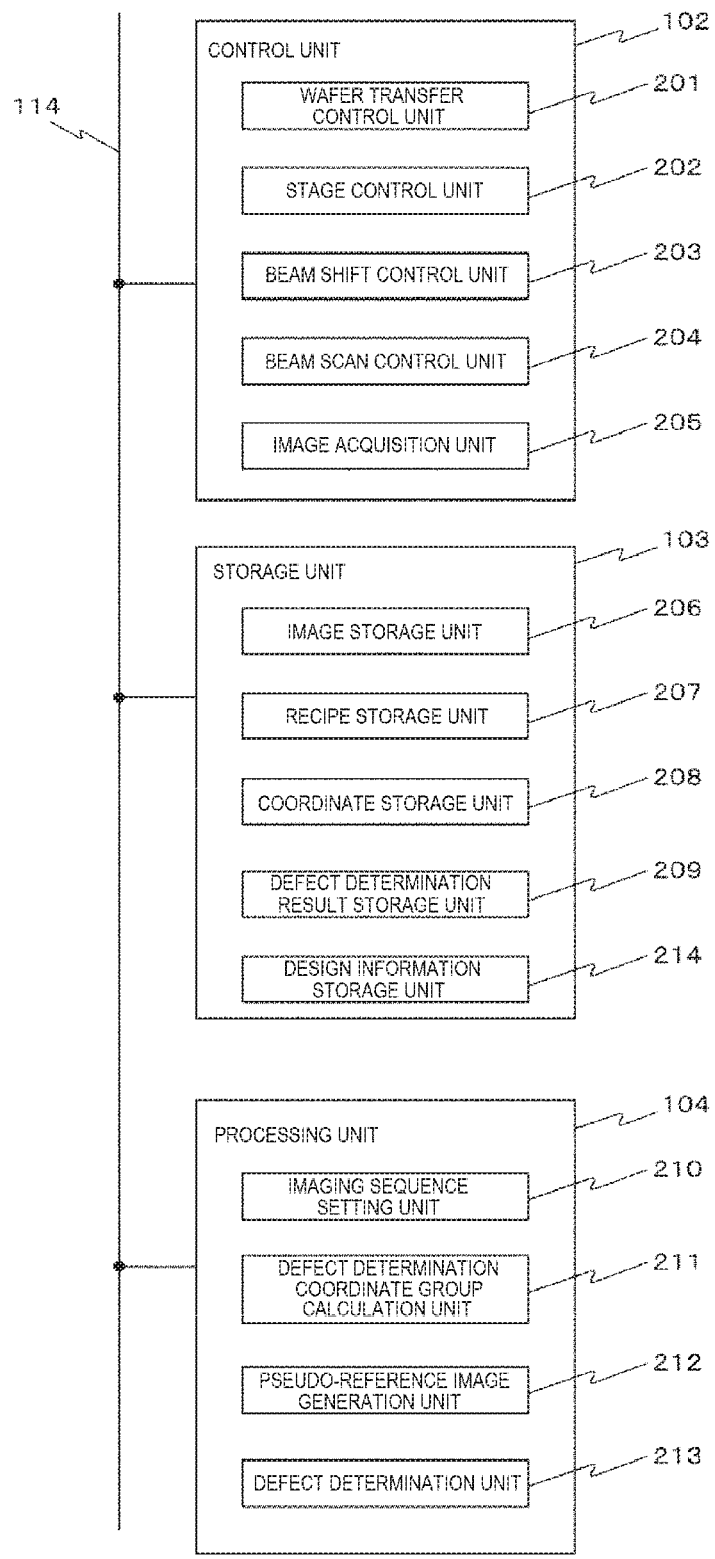
[FIG. 2]

[FIG. 3]
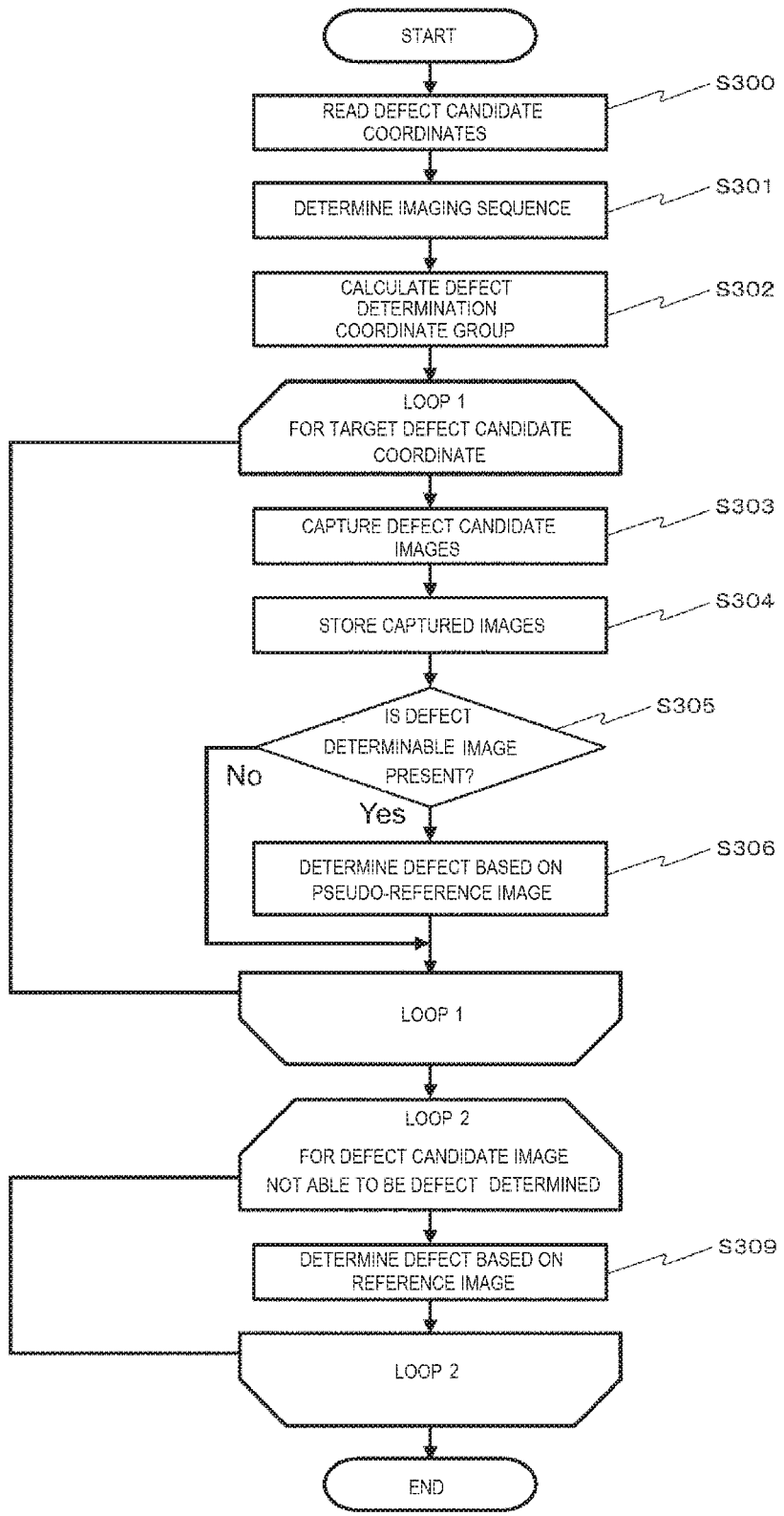

[FIG. 4]
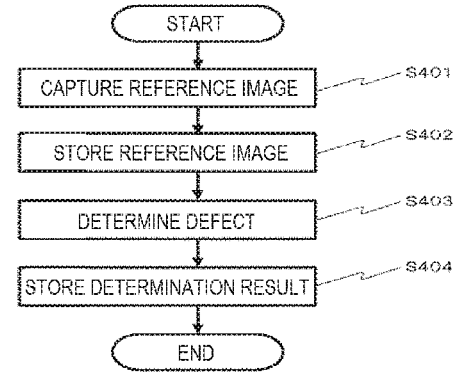
[FIG. 5]
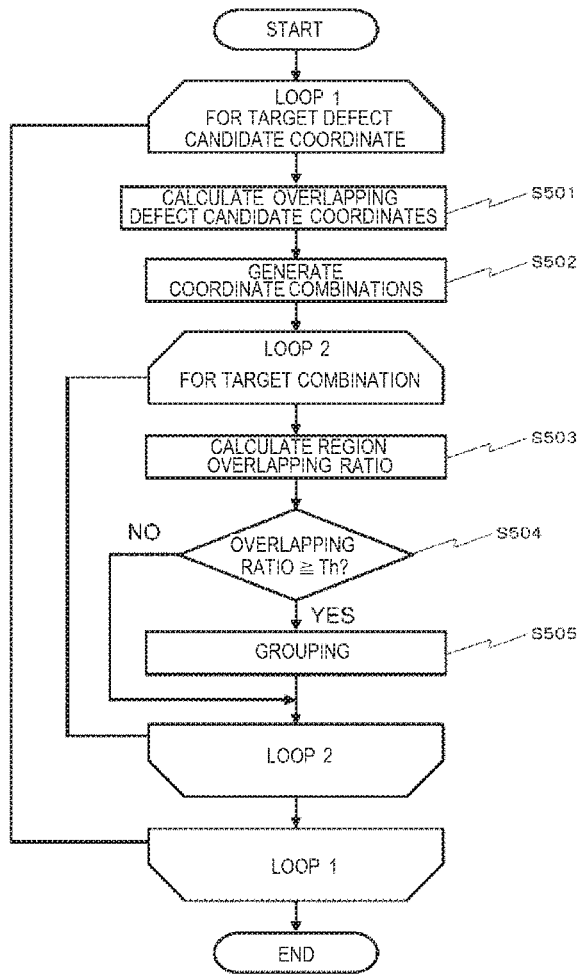

[FIG. 6]
| DEFECT CANDIDATE COORDINATE ID | CHIP ID | CHIP COORDINATE AT UPPER LEFT END OF VISUAL FIELD | CHIP COORDINATE AT LOWER RIGHT END OF VISUAL FIELD | OVERLAPPING DEFECT CANDIDATE COORDINATE ID | DEFECT DETERMINATION COORDINATE GROUP ID |
|---|---|---|---|---|---|
| 000001 | C0001 | (100, 100) | (300, 300) | - | - |
| 000002 | C0002 | (180, 180) | (380, 380) | - | - |
| 000003 | C0002 | (400, 550) | (600, 750) | - | - |
| 000004 | C0003 | (100, 800) | (300, 1000) | - | - |
| 000005 | C0004 | (0, 100) | (200, 300) | - | - |
| 000006 | C0006 | (0, 0) | (200, 200) | - | - |
| 000007 | C0007 | (200, 0) | (400, 200) | - | - |
| 000500 | C0550 | (600, 500) | (800, 700) | - | - |
[FIG. 7]
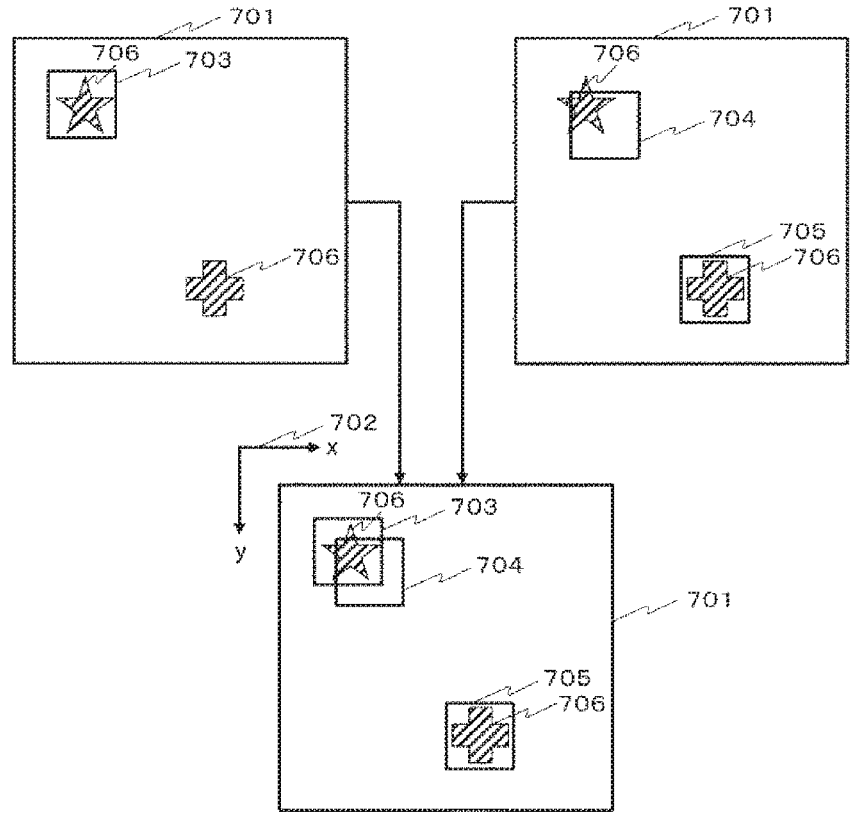

[FIG. 8]
| DEFECT CANDIDATE COORDINATE ID | CHIP ID | CHIP COORDINATE AT UPPER LEFT END OF VISUAL FIELD | CHIP COORDINATE AT LOWER RIGHT END OF VISUAL FIELD | OVERLAPPING DEFECT CANDIDATE COORDINATE ID | DEFECT DETERMINATION COORDINATE GROUP ID |
|---|---|---|---|---|---|
| 000001 | C0001 | (100, 100) | (300, 300) | 000002 000005 000006 000007 000010 000011 | - |
| 000002 | C0002 | (180, 180) | (380, 380) | - | - |
| 000003 | C0002 | (400, 550) | (600, 750) | - | - |
| 000004 | C0003 | (100, 800) | (300, 1000) | - | - |
| 000005 | C0004 | (0, 100) | (200, 300) | - | - |
| 000006 | C0006 | (0, 0) | (200, 200) | - | - |
| 000007 | C0007 | (200, 0) | (400, 200) | - | - |
| 000500 | C0550 | (600, 500) | (800, 700) | - | - |
[FIG. 9]
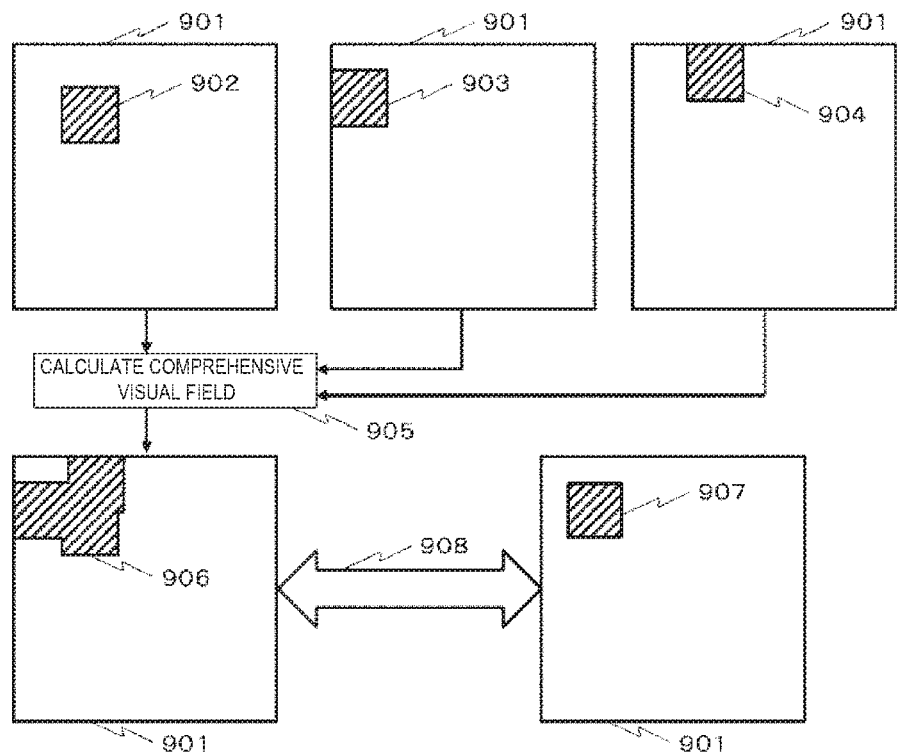

[FIG. 10]
| DEFECT CANDIDATE COORDINATE ID | CHIP ID | CHIP COORDINATE AT UPPER LEFT END OF VISUAL FIELD | CHIP COORDINATE AT LOWER RIGHT END OF VISUAL FIELD | OVERLAPPING DEFECT CANDIDATE COORDINATE ID | DEFECT DETERMINATION COORDINATE GROUP ID |
|---|---|---|---|---|---|
| 000001 | C0001 | (100, 100) | (300, 300) | 000002 000005 000006 000007 000010 000011 | G000001 G000002 |
| 000002 | C0002 | (180, 180) | (380, 380) | - | - |
| 000003 | C0002 | (400, 550) | (600, 750) | - | - |
| 000004 | C0003 | (100, 800) | (300, 1000) | - | - |
| 000005 | C0004 | (0, 100) | (200, 300) | - | - |
| 000006 | C0006 | (0, 0) | (200, 200) | - | - |
| 000007 | C0007 | (200, 0) | (400, 200) | - | - |
| 000500 | C0550 | (600, 500) | (800, 700) | - | - |
[FIG. 11]
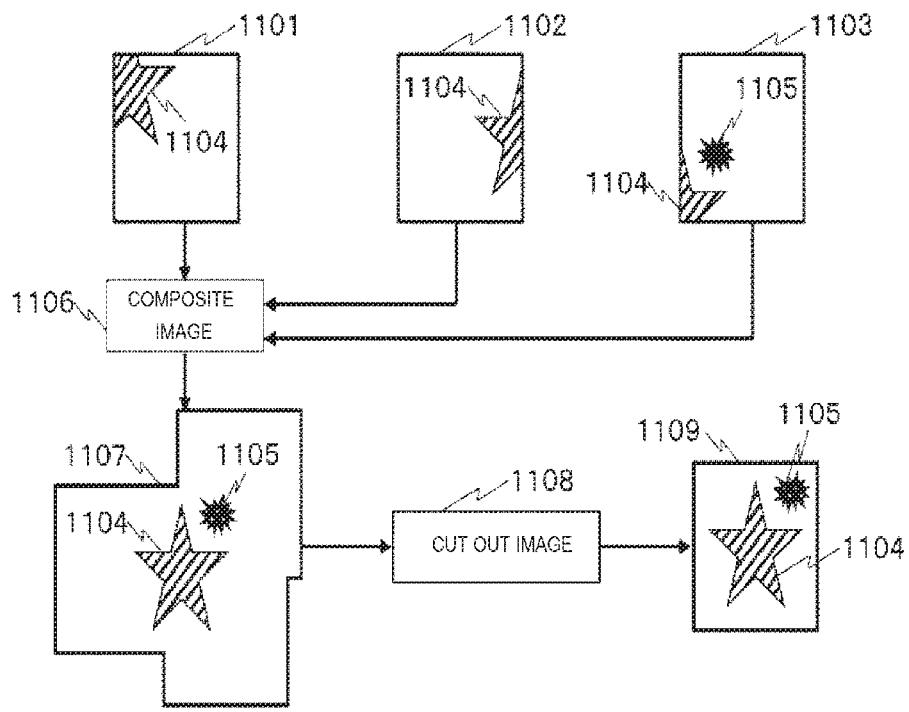

[FIG. 12]
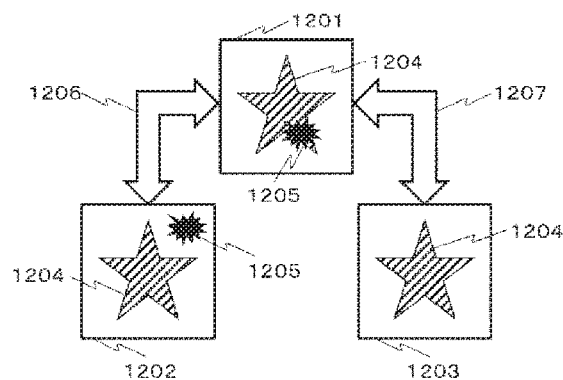
[FIG. 13]
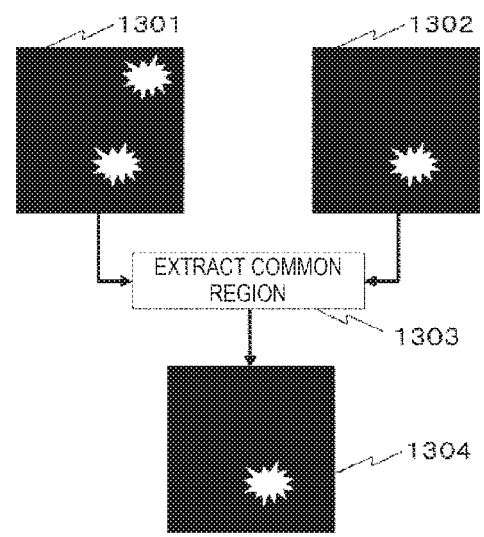
[FIG. 14]
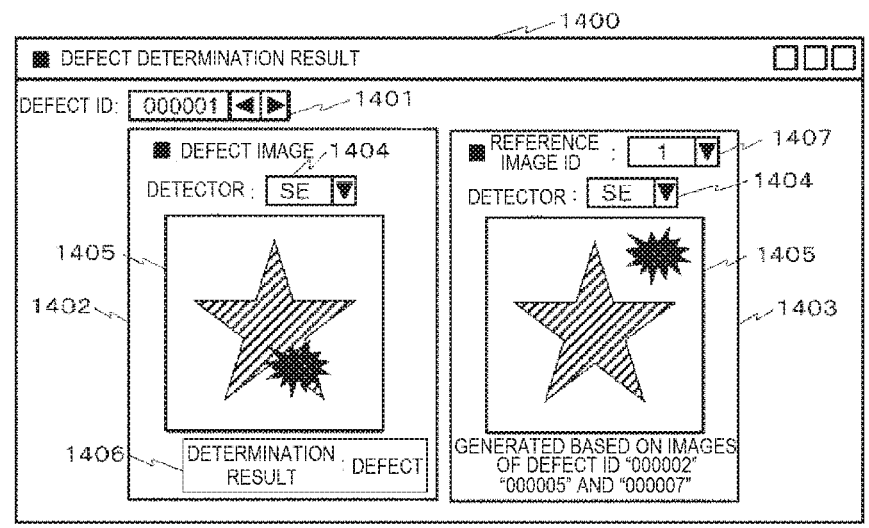

[FIG. 15]
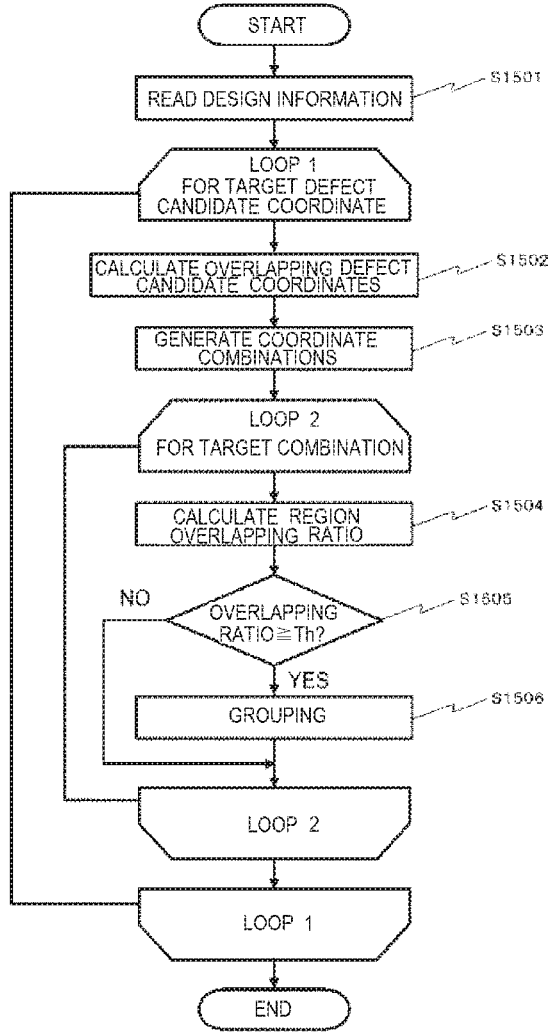
[FIG. 16]
| DEFECT CANDIDATE COORDINATE ID | CHIP ID | CHIP COORDINATE AT UPPER LEFT END OF VISUAL FIELD | CHIP COORDINATE AT LOWER RIGHT END OF VISUAL FIELD | OVERLAPPING DEFECT CANDIDATE COORDINATE ID | DEFECT DETERMINATION COORDINATE GROUP ID |
|---|---|---|---|---|---|
| 000101 | C0100 | (100, 100) | (300, 300) | - | - |
| 000102 | C0103 | (550, 100) | (750, 300) | - | - |
| 000103 | C0105 | (70, 500) | (270, 700) | - | - |
| 000104 | C0106 | (350, 400) | (550, 600) | .. | .. |
| 001000 | C0960 | (550, 700) | (750, 900) | - | - |

[FIG. 17]
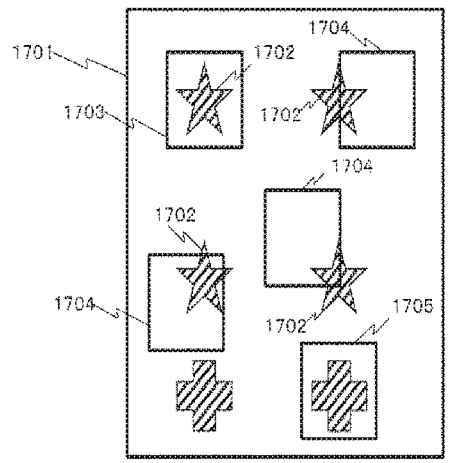
[FIG. 18]
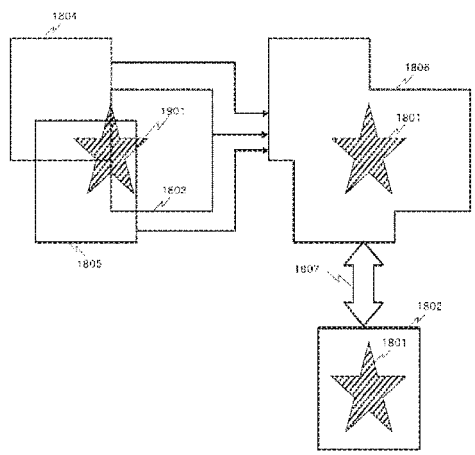
[FIG. 19]
| DEFECT DETERMINATION COORDINATE GROUP ID | IN-GROUP DEFECT CANDIDATE COORDINATE ID |
|---|---|
| G000001 | 000002<br>000005<br>000007 |
| G000002 | 000006<br>000010<br>000011 |
| G001000 | - |
1901  1902  1903

| DEFECT CANDIDATE COORDINATE ID (2002) | CHIP ID (2007) | CHIP COORDINATE AT UPPER LEFT END OF VISUAL FIELD (2003) | CHIP COORDINATE AT LOWER RIGHT END OF VISUAL FIELD (2004) | OVERLAPPING DEFECT CANDIDATE COORDINATE ID (2005) | DEFECT DETERMINATION COORDINATE GROUP ID (2006) |
|---|---|---|---|---|---|
| 000101 | C0100 | (100, 100) | (300, 300) | 000102<br>000103<br>000104<br>000107<br>000115<br>000118 | - |
| 000102 | C0103 | (550, 100) | (750, 300) | - | - |
| 000103 | C0105 | (70, 500) | (270, 700) | - | - |
| 000104 | C0106 | (350, 400) | (550, 600) | - | - |
| 001000 | C0980 | (550, 700) | (750, 900) | - | - |

| DEFECT DETERMINATION COORDINATE GROUP ID (2102) | IN-GROUP DEFECT CANDIDATE COORDINATE ID (2103) |
|---|---|
| G001001 | 000102<br>000103<br>000104 |
| G001002 | 000107<br>000115<br>000118 |
| G002000 | - |

| DEFECT CANDIDATE COORDINATE ID (2202) | CHIP ID (2207) | CHIP COORDINATE AT UPPER LEFT END OF VISUAL FIELD (2203) | CHIP COORDINATE AT LOWER RIGHT END OF VISUAL FIELD (2204) | OVERLAPPING DEFECT CANDIDATE COORDINATE ID (2205) | DEFECT DETERMINATION COORDINATE GROUP ID (2206) |
|---|---|---|---|---|---|
| 000101 | C0100 | (100, 100) | (300, 300) | 000102<br>000103<br>000104<br>000107<br>000115<br>000118 | G001001<br>G001002 |
| 000102 | C0103 | (550, 100) | (750, 300) | - | - |
| 000103 | C0105 | (70, 500) | (270, 700) | - | - |
| 000104 | C0106 | (350, 400) | (550, 600) | - | - |
| 001000 | C0980 | (550, 700) | (750, 900) | - | - |

[FIG. 23]
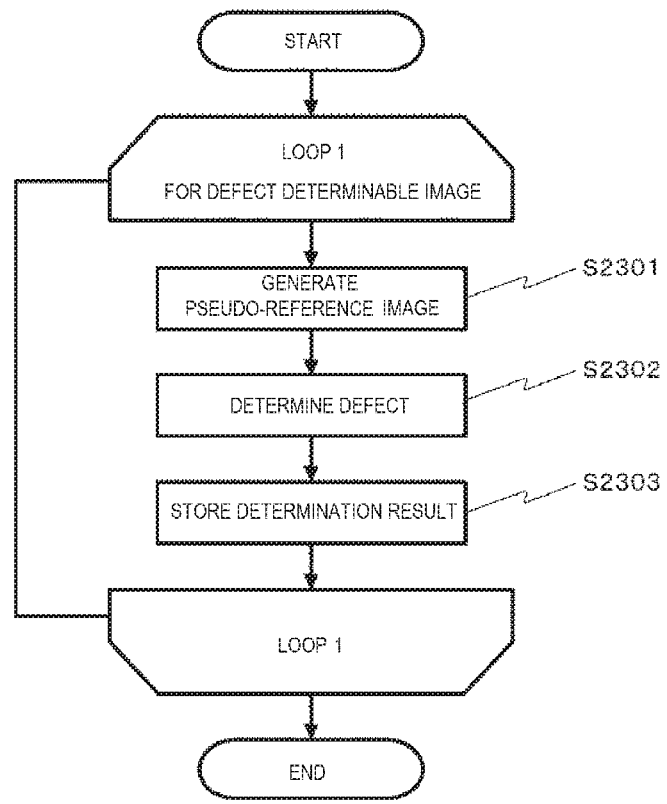
[FIG. 24]
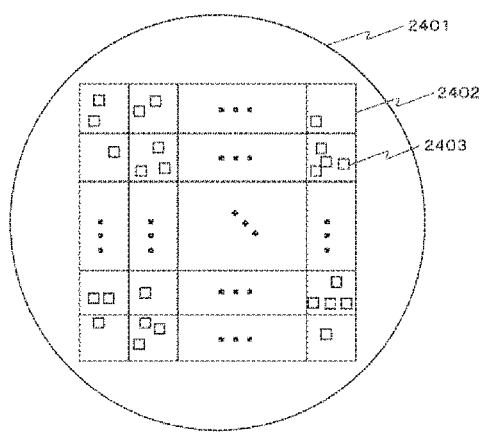

[FIG. 25]

| DEFECT CANDIDATE COORDINATE ID | CHIP ID | CHIP COORDINATE AT UPPER LEFT END OF VISUAL FIELD | CHIP COORDINATE AT LOWER RIGHT END OF VISUAL FIELD | OVERLAPPING DEFECT CANDIDATE COORDINATE ID | DEFECT DETERMINATION COORDINATE GROUP ID |
|---|---|---|---|---|---|
| 000001 | C0001 | (100, 100) | (300, 300) | 000002<br>000005<br>000006<br>000007<br>000010<br>000011 | G000001<br>G000002 |
| 000002 | C0002 | (180, 180) | (380, 380) | 000001<br>000005 | - |
| 000003 | C0002 | (400, 550) | (600, 750) | 000020<br>000025<br>000030 | G000003 |
| 000500 | C0550 | (600, 500) | (800, 700) | 000490<br>000491<br>000495<br>000497<br>000498 | G000300 |

2501

2502 2507 2503 2504 2505 2506

DEFECT OBSERVATION DEVICE AND DEFECT OBSERVATION METHOD

TECHNICAL FIELD

The present invention relates to a defect observation device and a defect observation method.

BACKGROUND ART

In order to improve a yield of a semiconductor device, it is important to quickly determine a cause of a defect in a manufacturing process. Typically, a defect is analyzed using an appearance inspection device and a defect observation device in a semiconductor manufacturing site. In recent years, with miniaturization and complication of the semiconductor device, defect size has also become smaller. Therefore, an output of the appearance inspection device which has been adjusted to have high sensitivity in order to detect a fine defect includes not only a true defect but also a false report.

Therefore, it is desired that the presence or absence of a defect in defect candidate images captured at defect candidate coordinates output from the appearance inspection device is determined by the defect observation device, and only an image with a true defect is presented to a user, thereby reducing a burden of visual observation of the user.

As a method of determining the presence or absence of a defect in a defect candidate image, for example, in PTL 1, a difference between the defect candidate image and a reference image is detected as a defect by comparing the defect candidate image and the reference image captured at a normal portion formed with a pattern similar to that of the defect candidate image.

PRIOR ART LITERATURE

Patent Literature

PTL 1: JP-A-2001-325595

SUMMARY OF INVENTION

Technical Problem

It is necessary to observe all images which include a true defect among defect candidate coordinates output from the appearance inspection device in order to recognize a highly fatal defect in a developmental stage of a semiconductor device process.

However, in PTL 1, the reference image is captured for each defect candidate image to perform defect determination on the defect candidate image. Therefore, when a large number of (for example, tens of thousands to hundreds of thousands) defect candidate coordinates are output from the appearance inspection device, it takes a lot of time to capture not only the defect candidate images but also reference images corresponding to normal portions formed with patterns similar to those of the defect candidate images, and the imaging time of the defect observation device increases.

An object of the invention is to shorten the imaging time in the defect observation device.

Solution to Problem

A defect observation device according to an aspect of the invention includes a defect determination coordinate creation unit by which coordinates of a plurality of second defect candidates are determined as overlapping defect candidate coordinates, the plurality of second defect candidates respectively having, in a plurality of second imaging visual field regions overlapping a first imaging visual field region, a circuit pattern which partly overlaps a circuit pattern in the first imaging visual field region where a first defect candidate which is a defect determination target among a plurality of defect candidates of a sample is present; a pseudo-reference image generation unit that generates a pseudo-reference image including a circuit pattern of the first defect candidate by superimposing a plurality of images respectively captured at the plurality of overlapping defect candidate coordinates; and a defect determination unit that compares an image which is a defect determination target captured at coordinates of the first defect candidate with the pseudo-reference image to determine presence or absence of a defect in the image which is a defect determination target.

A defect observation method according to an aspect of the invention includes: determining coordinates of a plurality of second defect candidates as overlapping defect candidate coordinates, the plurality of second defect candidates respectively having, in a plurality of second imaging visual field regions overlapping a first imaging visual field region, a circuit pattern which partly overlaps a circuit pattern in the first imaging visual field region where a first defect candidate which is a defect determination target among a plurality of defect candidates of a sample is present; generating a pseudo-reference image including a circuit pattern of the first defect candidate by superimposing a plurality of images respectively captured at the plurality of overlapping defect candidate coordinates, and comparing an image which is a defect determination target captured at coordinates of the first defect candidate with the pseudo-reference image to determine presence or absence of a defect in the image which is a defect determination target.

Advantageous Effect

According to the invention, the imaging time in the defect observation device can be shortened.

BRIEF DESCRIPTION OF DRAWINGS

FIG. 1 is a configuration diagram of a defect observation device in a first embodiment.

FIG. 2 is a configuration diagram of a control unit, a storage unit, and a processing unit of the defect observation device.

FIG. 3 is a diagram showing a processing flow of acquiring a defect observation image and determining the presence or absence of a defect.

FIG. 4 is a diagram showing a processing flow of determining a defect by capturing a reference image.

FIG. 5 is a diagram showing a processing flow of calculation processing of a defect determination coordinate group in the first embodiment.

FIG. 6 is a diagram showing information associated with defect candidate coordinate ID.

FIG. 7 is a diagram showing a chip region and imaging visual field regions with respect to a chip coordinate system.

FIG. 8 is a diagram showing information associated with defect candidate coordinate ID after overlapping defect candidate coordinates are calculated.

FIG. 9 is a diagram showing a method of calculating an overlapping ratio of imaging visual field regions with respect to chip coordinates of a plurality of defect candidate coordinates.

FIG. 10 is a diagram showing information associated with defect candidate coordinates ID after grouping.

FIG. 11 is a diagram showing a method of generating a pseudo-reference image.

FIG. 12 is a diagram showing a method of comparing a defect candidate image which is a defect determination target with the pseudo-reference image.

FIG. 13 is a diagram showing a result of comparing the defect candidate image which is a defect determination target with the pseudo-reference image.

FIG. 14 is a diagram showing an example of a display screen of a defect determination result.

FIG. 15 is a diagram showing a processing flow of calculation processing of a defect determination coordinate group in a second embodiment.

FIG. 16 is a diagram showing information associated with defect candidate coordinate ID.

FIG. 17 is a diagram showing design information around defect candidate coordinates which is a defect determination target.

FIG. 18 is a diagram showing relative imaging visual field regions of defect candidate coordinates with respect to a circuit pattern.

FIG. 19 is a diagram showing information regarding a group after grouping.

FIG. 20 is a diagram showing information associated with defect candidate coordinate ID after overlapping defect candidate coordinates are calculated.

FIG. 21 is a diagram showing information regarding a group after grouping.

FIG. 22 is a diagram showing information associated with defect candidate coordinate ID after grouping.

FIG. 23 is a diagram showing a processing flow of defect determination processing according to the pseudo-reference image.

FIG. 24 is a diagram showing chips on a wafer and imaging visual fields at defect candidate coordinates.

FIG. 25 is a diagram showing information associated with defect candidate coordinate ID after a defect determination coordinate group is calculated.

DESCRIPTION OF EMBODIMENTS

Hereinafter, embodiments will be described with reference to the drawings.

A defect observation device according to an embodiment observes various defects generated in a manufacturing line of a semiconductor wafer and determines the presence or absence of a defect in a defect candidate image by using the defect candidate image captured at defect candidate coordinates.

In order to improve a yield of a semiconductor, it is important to quickly determine a cause of a defect in a manufacturing process. A defect is analyzed using an appearance inspection device and a defect observation device in a semiconductor manufacturing site.

Here, the appearance inspection device observes a wafer using an optical element or an electron beam and outputs detected defect coordinates. Since it is important to process a wide range at a high speed, the appearance inspection device reduces an amount of image data by increasing a pixel size of an image to be acquired as much as possible (that is, reducing the resolution). In many cases, even if the presence of a defect can be confirmed from a detected low-resolution image, a type of the defect cannot be determined in detail. Therefore, a defect observation device is used.

The defect observation device captures an image at a position of defect candidate coordinates on a wafer output from the appearance inspection device at a high resolution and outputs the image, and a defect observation device (review SEM) using a scanning electron microscope (SEM) is widely used. It is desirably to automate an observation operation in a mass production line of a semiconductor, and a defect observation device is equipped with a function of performing an automatic defect review (ADR) which automatically reviews an image in a defect position in a sample and a function of performing an automatic defect classification (ADC) which automatically classifies an image reviewed by the ADR.

Since a plurality of same chips are arranged in a semiconductor wafer, a coordinate system (hereinafter, referred to as a "chip coordinate") from the origin of each chip is used as a defect candidate coordinate, and an image captured at a position with the same chip coordinate but on different chips (for example, a position moved by one chip from a position of the defect candidate coordinate) can be used as a reference image.

It is necessary to observe all images which include a true defect among defect candidate coordinates output from the appearance inspection device in order to recognize a highly fatal defect in defect observation of a semiconductor device. However, when a large number of (for example, tens of thousands to hundreds of thousands) defect candidate coordinates are output from the appearance inspection device, it takes a lot of time to even only capture reference images captured at portions where patterns similar to defect candidate images are formed, and the imaging time of the defect observation device increases.

Therefore, in the embodiments, a defect candidate image different from a defect candidate image which is a defect determination target is used to determine the presence or absence of a defect in the defect candidate image which is a defect determination target, so that the imaging time of the defect observation device is shortened when a large number of defect candidate coordinates are output from the appearance inspection device.

Specifically, in the defect observation device which observes various defects generated in the manufacturing line of the semiconductor wafer, a pseudo-reference image is generated based on defect candidate images captured at defect candidate coordinates and including, in imaging visual fields, a circuit pattern which is partly similar to a circuit pattern in an imaging visual field at a defect candidate coordinate which is a defect determination target, and the defect candidate image captured at the defect candidate coordinate which is a defect determination target is compares with the pseudo-reference image to determine the presence or absence of a defect in the defect candidate image captured at the defect candidate coordinate which is a defect determination target. As a result, since it is not necessary to capture a reference image corresponding to a normal portion formed with a pattern similar to that of the defect candidate image, the imaging time of the defect observation device can be shortened.

First Embodiment

The configuration of a defect observation device according to a first embodiment will be described with reference to FIG. 1.

As shown in FIG. 1, the defect observation device includes a scanning electron microscope (SEM) 101 that captures an image, a control unit 102 that performs overall control, a storage unit 103 that stores information in a magnetic disk, a semiconductor memory or the like, a processing unit 104 that performs processing according to a program, an external storage medium input and output unit 105 that inputs and outputs information to and from an external storage medium connected to a device, a user interface unit 106 that controls input and output of information to and from a user, and a network interface unit 107 that communicates with other devices via a network. Further, an input and output terminal 113 which includes a keyboard, a mouse, a display and the like is connected to the user interface unit 106.

The scanning electron microscope 101 includes a movable stage 109 where a sample wafer 108 is mounted, an electron source 110 that irradiates the sample 108 with an electron beam, a detector 111 that detects secondary electrons, reflected electrons or the like generated from the sample wafer 108, in addition, an electron lens (not shown) that focuses the electron beam on the sample wafer 108, a deflector (not shown) that scans the sample wafer 108 with the electron beam, and an image generation unit 112 that digitally converts a signal from the detector 111 to generate a digital image. They are connected to each other via a bus 114 and can exchange information with each other.

The configurations of the control unit 102, the storage unit 103, and the processing unit 104 will be described with reference to FIG. 2.

The control unit 102 includes a wafer transfer control unit 201 that controls transfer of the sample wafer 108, a stage control unit 202 that controls the stage, a beam shift control unit 203 that controls an irradiation position of the electron beam, a beam scan control unit 204 that controls scanning of the electron beam, and an image acquisition unit 205.

The storage unit 103 includes an image storage unit 206 that stores an acquired image data, a recipe storage unit 207 that stores an imaging condition (for example, an accelerated voltage, a probe current, the number of added frames, imaging visual field size and the like), a processing parameter and the like, a coordinate storage unit 208 that stores coordinates of a position to be observed (defect candidate coordinates), a defect determination result storage unit 209 that stores a result of determining the presence or absence of a defect in an image (defect candidate image) captured at a position of the defect candidate coordinates, and a design information storage unit 214 that stores design information of a semiconductor device which is an observation target.

The processing unit 104 includes an imaging sequence setting unit 210 that determines a sequence of capturing the defect candidate images, a defect determination coordinate group calculation unit (also referred to as a defect determination coordinate creation unit) 211 that calculates a group which includes other defect candidate coordinates necessary for defect determination of a defect candidate coordinate, a pseudo-reference image generation unit 212 that generates a pseudo-reference image for comparison with a defect candidate image, and a defect determination unit 213 that determines the presence or absence of a defect in the defect candidate image.

The imaging sequence setting unit 210, the defect determination coordinate group calculation unit 211, the pseudo-reference image generation unit 212, and the defect determination unit 213 may be configured as hardware designed to perform individual processing (calculation), or may be implemented as software and executed using a general-purpose arithmetic device (for example, a CPU, a GPU and the like).

Next, a method for acquiring an image of specified coordinates by the image acquisition unit 205 will be described.

First, the sample wafer 108 which is a measurement target is provided on the stage 109 using a robot arm under the control of the wafer transfer control unit 201. Next, the stage 109 is moved by the stage control unit 202 so that an imaging visual field is included in a beam irradiation range. At this time, in order to absorb a movement error of the stage, a stage position is measured and a beam irradiation position is adjusted by the beam shift control unit 203 so as to eliminate the movement error. The electron beam is emitted from an electron source 110 and the beam scan controller 204 performs scanning in the imaging visual field. The secondary electrons or reflected electrons generated from the sample wafer 108 irradiated by the electron beam are detected by the detector 111, and are converted into a digital image through the image generation unit 112. A captured image is stored in the image storage unit 206 with accompanying information such as an imaging condition or imaging date and time.

Next, a defect observation method will be described with reference to FIG. 3, FIG. 4, and FIG. 23.

First, defect candidate coordinate information output by other appearance inspection devices is read from the coordinate storage unit 208 (S300). All of the read defect candidate coordinates may be observation targets, or those sampled based on a user specified condition may be observation targets. Next, the imaging sequence setting unit 210 determines a sequence of capturing defect candidate images in defect candidate coordinate positions (S301).

Next, the defect determination coordinate group calculation unit 211 extracts imaging coordinates of images used for defect determination of any defect candidate coordinates from other defect candidate coordinates (S302). A set of extracted defect candidate coordinates is referred to as a defect determination coordinate group. The processing of calculating the defect determination coordinate group S302 will be described in detail later. Subsequent processing S303 to S306 is performed with respect to each defect candidate coordinate.

First, the image acquisition unit 205 captures defect candidate images in the defect candidate coordinates (S303), and the captured defect candidate images are stored in the image storage unit 206 (S304). Next, it is determined whether or not defect determination can be performed on each defect candidate image stored in the image storage unit 206, and it is determined whether or not there is more than one image that is determined to be defect determinable (hereinafter, referred to as defect determinable image) (S305). S305 will be described in detail later.

When it is determined that there are defect determinable images in S305, defect determination is performed by performing processing from S2301 to S2303 shown in FIG. 23 on each defect determinable image (S306). In S2301, a pseudo-reference image for comparison with the defect determinable image is generated only from defect candidate images stored in the image storage unit 206. In S2302, the presence or absence of a defect in the defect determinable image is determined by comparing the defect determinable image with the pseudo-reference image. In S2303, a defect determination result output from S2302 is stored in the defect determination result storage unit 209. S2301 and S2302 will be described in detail later.

After S303 to S306 are performed with respect to each defect candidate coordinate, processing of S309 is performed with respect to each defect candidate image that is not defect-determined (hereinafter, referred to as a defect undetermined image) in S306. In S309, as shown in FIG. 4, a reference image used for comparison checking with a defect undetermined image is captured (S401), the captured reference image is stored in the image storage unit 206 (S402), the defect undetermined image is compared with the reference image to determine the presence or absence of a defect in the defect undetermined image (S403), and a determination result thereof is stored in the defect determination result storage unit 209 (S404). The presence or absence of a defect in all defect candidate images can be determined by the above processing.

Next, the processing S302 of calculating the defect determination coordinate group shown in FIG. 3 will be described in detail with reference to FIG. 5. Subsequent processing S501 to S505 is performed with respect to each defect candidate coordinate.

First, overlapping defect candidate coordinates on different chips from a target defect candidate coordinate and having imaging visual fields partially overlap with that of the target defect candidate coordinate with respect to the chip coordinate are calculated (S501).

FIG. 6 is a diagram showing information 601 associated with defect candidate coordinate ID 602 before performing the processing of S501, and chip ID 607 with a defect candidate coordinate, chip coordinate 603 at the upper left end of an imaging visual field region, chip coordinate 604 at the lower right end of the imaging visual field region, overlapping defect candidate coordinate ID 605, and defect determination coordinate group ID 606 are associated with each defect candidate coordinate ID 602.

Since the chip coordinate 603 at the upper left end of the imaging visual field region and the chip coordinate 604 at the lower right end of the imaging visual field region may be understood as an imaging visual field with respect to the chip coordinate at the defect candidate coordinate, a chip coordinate at the upper right end of the imaging visual field region and a chip coordinate at the lower left end of the imaging visual field may be used.

FIG. 24 shows chips 2402 on a wafer 2401 and imaging visual field regions 2403 at the defect candidate coordinate. As shown in FIG. 24, a plurality of chips 2402 is provided on the wafer 2401.

FIG. 7 shows a chip region 701, circuit patterns 706, and among the imaging visual field regions shown in FIG. 24, imaging visual field regions 703 to 705 of defect candidate coordinates with the defect candidate coordinate ID of 000001 to 000003, respectively, with respect to a chip coordinate system 702. Since FIG. 7 shows the imaging visual field regions with respect to the chip coordinate system, the defect candidate coordinates with the defect candidate coordinate ID of 000001 to 000003 may be present in the same chip, or may be present in different chips.

In the example of FIG. 7, the defect candidate coordinate with the defect candidate coordinate ID of 000002 and the defect candidate coordinate with the defect candidate coordinate ID of 000001 are on different chips, and since the imaging visual field region 703 partially overlaps the imaging visual field region 704 with respect to the chip coordinate, the defect candidate coordinate with the defect candidate coordinate ID 602 of 000002 is calculated as an overlapping defect candidate coordinate of the defect candidate coordinate with the defect candidate coordinate ID 602 of 000001.

Provided that the defect candidate coordinate with the defect candidate coordinate ID of 000001 and the defect candidate coordinate with the defect candidate coordinate ID of 000002 are on the same chip and the imaging visual field regions overlap, the defect candidate coordinate with the defect candidate coordinate ID 602 of 000002 is not calculated as an overlapping defect candidate coordinate of the defect candidate coordinate with the defect candidate coordinate ID 602 of 000001. This is because that a defect candidate image at the defect candidate coordinate with the defect candidate coordinate ID of 000001 and a defect candidate image at the defect candidate coordinate with the defect candidate coordinate ID of 000002 include a common position on the wafer, if the defect candidate coordinate with the defect candidate coordinate ID 602 of 000002 is used when the defect candidate coordinate with the defect candidate coordinate ID 602 of 000001 is defect-determined, it may be determined that the defect is not present (false report) even a defect is actually present in the common position.

Since the imaging visual field region 705 does not overlap the imaging visual field region 703 with respect to the chip coordinate, the defect candidate coordinate with the defect candidate coordinate ID 602 of 000003 is not calculated as an overlapping defect candidate coordinate of the defect candidate coordinate with the defect candidate coordinate ID 602 of 000001.

In S501, a defect candidate coordinate (other than the target defect candidate coordinate) which includes, in the imaging visual field region, a circuit pattern which is partly similar to a circuit pattern in the imaging visual field region in the target defect candidate coordinate is calculated as an overlapping defect candidate coordinate. FIG. 8 is a diagram showing information 801 associated with defect candidate coordinate ID 802 after overlapping defect candidate coordinates of a defect candidate coordinate with the defect candidate coordinate ID 802 of 000001 is calculated, in which similar to FIG. 6, chip ID 807 with a defect candidate coordinate, chip coordinate 803 at the upper left end of an imaging visual region, chip coordinate 804 at the lower right end of the imaging visual region, overlapping defect candidate coordinate ID 805, and defect determination coordinate group ID 806 are associated with each defect candidate coordinate ID 802.

In the example of FIG. 8, defect candidate coordinates with the defect candidate coordinate ID 802 of 000002, 000005, 00006, 000007, 000010, and 000011 are shown as overlapping defect candidate coordinates with respect to a defect candidate coordinate with the defect candidate coordinate ID 802 of 000001.

Returning to the description of FIG. 5, after the processing of S501, any combination which includes one or more overlapping defect candidate coordinates calculated in S501 is generated (S502). Subsequent processing S503 to S505 is performed on each combination. However, the processing of S503 to S505 is not performed on a combination including even one overlapping defect candidate coordinate in a defect determination coordinate group extracted in S505 to be described later.

First, a ratio (overlapping ratio) of an imaging visual field region of the target defect candidate coordinate overlapping a visual field region of a pseudo-reference image generated from images of overlapping defect candidate coordinates in the combination with respect to the chip candidate is calculated (S503). A visual field with respect to the chip coordinate of the pseudo-reference image is recorded as an effective visual field.

FIG. 9 shows a method of calculating the ratio of the imaging visual field region of the target defect candidate coordinate overlapping the visual field of the pseudo-reference image with respect to the chip coordinate when overlapping defect candidate coordinates with the defect candidate coordinate ID of 000002, 000005, and 000007 are chosen as the combination. As shown in FIG. 9, a chip region 901 is the chip region around a defect candidate coordinate with the defect candidate coordinate ID 802 of 000001, and imaging visual field regions 902, 903, and 904 respectively represent imaging visual field regions of defect candidate coordinates with defect candidate coordinate ID of 000002, 000005, and 000007 with respect to the chip coordinate.

In S503, an effective visual field region 906 overlapping at least one of the imaging visual field regions 902 to 904 is calculated (905), an imaging visual field region 907 with respect to the chip coordinate of the defect candidate coordinate with the defect candidate coordinate ID 802 of 000001 is compared with the effective visual field region 906 (908), and a ratio of the effective visual field region 906 occupying an area of the imaging visual field region 907 is calculated as the overlapping ratio.

Here, as shown in FIG. 9, the effective visual field region 906 is a comprehensive visual field region obtained by calculating a comprehensive visual field of the imaging visual field regions 902 to 904.

Next, it is determined whether or not the overlapping ratio calculated in S503 is equal to or greater than a threshold (S504), and if the overlapping ratio is equal to or greater than the threshold value, it is determined that the target defect candidate coordinate can be checked by comparison, and a set of the overlapping defect candidate coordinates included in a target combination is extracted as a defect determination coordinate group (S505).

FIG. 19 is a diagram showing information 1901 regarding a group after a group 2 in FIG. 5 is extracted with respect to the defect candidate coordinate with the defect candidate coordinate ID of 000001, and in-group defect candidate coordinate ID 1903 is associated with each defect determination coordinate group ID 1902. In the example of FIG. 19, defect candidate coordinates with the defect candidate coordinate ID of 000002, 000005 and 000007 are included in a group with the group ID 1902 of G000001, and defect candidate coordinates with the defect candidate coordinate ID of 000006, 000010, and 0000011 are included in a group with the group ID 1902 of G000002.

Further, FIG. 10 is a diagram showing information 1001 associated with defect candidate coordinate ID 1002 after the group 2 in FIG. 5 is extracted related to a defect candidate coordinate with the defect candidate coordinate ID 1002 of 000001, in which similar to FIG. 6, chip ID 1007 with a defect candidate coordinate, chip coordinate 1003 at the upper left end of an imaging visual region, chip coordinate 1004 at the lower right end of the imaging visual region, overlapping defect candidate coordinate ID 1005, and defect determination coordinate group ID 1006 are associated with each defect candidate coordinate ID 1002. In the example of FIG. 10, a group with the group ID of G000001 and a group with the group ID of G000002 are extracted as defect determination coordinate groups for the defect candidate coordinate with the defect candidate coordinate ID 1002 of 000001.

Next, determination of presence or absence of the defect determinable image in S305 as shown in FIG. 3 will be described in detail. In S305, it is checked whether or not each defect candidate image stored in the image storage unit 206 satisfies all the flowing three conditions, and a defect candidate image that satisfies all conditions is determined to be defect determinable. A first condition is that a defect candidate image which is a determination target is determined to be not defect-determinable in S306. A second condition is that one or more defect determination coordinate groups are extracted for the defect candidate image which is a determination target. A third condition is that a defect candidate image at a defect candidate coordinate in a defect determination coordinate group for the defect candidate image which is a determination target is stored in the image storage unit 206. In a case where there is only one image determined to be defect determinable, processing of step S306 is performed for each defect candidate image which satisfies the above conditions to determine the presence or absence of a defect in the defect candidate image.

FIG. 25 will be described as an example. FIG. 25 is a diagram showing information 2501 associated with defect candidate coordinate ID 2502 after overlapping defect candidate coordinates of a defect candidate coordinate with the defect candidate coordinate ID 2502 of 000001 is calculated, in which similar to FIG. 6, chip ID 2507 with a defect candidate coordinate, chip coordinate 2503 at the upper left end of an imaging visual region, chip coordinate 2504 at the lower right end of the imaging visual region, overlapping defect candidate coordinate ID 2505, and defect determination coordinate group ID 2506 are associated with each defect candidate coordinate ID 2502. Here, for a purpose of explanation, provided that all defect candidate coordinates are not defect-determined in S306 and defect candidate images at defect candidate coordinates with defect the candidate coordinate ID of 000001 to 000011 are stored in the image storage unit 206.

At this time, since the group with the group ID of G000001 and the group with the group ID of G000002 are extracted as defect determination coordinate groups for the defect candidate coordinate with the defect candidate coordinate ID of 000001, the second condition is satisfied. In addition, since defect candidate images at the defect candidate coordinates with the defect candidate coordinate ID of 000002, 000005, and 000007 in the group with the group ID of G000001 and the defect candidate coordinates with the defect candidate coordinate ID of 000006, 000010, and 000011 in the group with the group ID of G000002 are stored in the image storage unit 206, the third condition is satisfied. Since it is clear that the first condition is assumed to be satisfied, the defect candidate image at the defect candidate coordinate with the defect candidate coordinate ID of 000001 is determined to be defect determinable.

Further, provided that all defect candidate coordinates are not defect-determined in S306 and defect candidate images at defect candidate coordinates with the defect candidate coordinate ID of 000005 to 000500 are not stored in the image storage unit 206. In this case, defect candidate images at the defect candidate coordinates with the defect candidate coordinate ID of 000005 and 000007 in the group with the group ID of G000001 and at the defect candidate coordinates with the defect candidate coordinate ID of 000006, 000010 and 000011 in the group with the group ID of G000002 are not stored in the image storage unit 206. Therefore, the third condition is not satisfied, and the defect candidate image at the defect candidate coordinate with the defect candidate coordinate ID of 000001 is not determined as defect determinable at this time. This is because the pseudo-reference image used for comparison with the defect candidate image at the defect candidate coordinates with the defect candidate coordinate ID of 000001 cannot be generated if the defect candidate image at the defect candidate coordinates in the defect determination coordinate group is not stored in the image storage unit 206.

Next, processing S2301 of generating the pseudo-reference image will be described in detail with reference to FIG. 11.

Images 1101 to 1103 are defect candidate images respectively captured at the defect candidate coordinates with the defect candidate coordinate ID of 000002, 000005, and 000007 in G000001, and a circuit pattern 1104 and a defect 1105 are captured in the images 1101 to 1103. In S2301, an image 1107 obtained by compositing the images 1101 to 1103 is generated based on an imaging visual field region with respect to a chip coordinate of the images 1101 to 1103 (1106), a region that overlaps an imaging visual field region of a defect determinable image with respect to a chip coordinate is cut out from the image 1107 (1108), and a pseudo-reference image 1109 including a region of a circuit pattern similar to that of the defect determinable image is generated. It should be noted that, with respect to a region where a plurality of images overlaps, an average value of pixel values in the overlapping region may be used, or a pixel value of one image may be used as a representative when the plurality of images are composited.

Next, defect determination processing S2302 of the defect determinable image will be described in detail with reference to FIGS. 12 and 13.

An image 1201 is a defect determinable image, an image 1202 and an image 1203 are pseudo-reference images generated from defect candidate images respectively captured at the defect candidate coordinates in G000001 and G000002, and a circuit pattern 1204 and/or a defect 1205 are captured in the images 1201 to 1203. In S2302, a defect candidate detection result image 1302 is calculated by comparing the image 1201 and the image 1203 (1207).

When a defect candidate (a region shown in white) is present in the defect candidate detection result image 1302, it is determined that a defect is included in the image 1201. Since defect candidate coordinates output by the appearance inspection device include many false reports caused by a manufacturing error, it is rare that a defect is included in the pseudo-reference image and defect determination of the image 1201 can be performed by the above-mentioned method.

Next, processing in a case where defect determination is performed more accurately will be described. First, a defect candidate detection result image 1301 is calculated by comparing the image 1201 and the image 1202 (1206), and the defect candidate detection result image 1302 is calculated by comparing the image 1201 and the image 1203 (1207). Defect candidates (regions shown in white) shown in both the defect candidate detection result image 1301 and the defect candidate detection result image 1302 are detected.

Next, a common defect candidate region is extracted from the image 1301 and the image 1302 (1303). If a defect candidate region is present in a common region extraction result 1304, it is determined that a defect is included in the defect determinable image 1201 (true defect), and if no defect candidate is present, it is determined that a defect is not included in the defect determinable image 1201 (false report).

Next, an example of a screen 1400 where a defect determination result with respect to a defect candidate image is displayed on the input and output terminal 113 will be described as an example with reference to FIG. 14.

The screen 1400 includes a displayed defect ID selection unit 1401, a defect candidate image display unit 1402, and a reference image display unit 1403. An image (thumbnail image 1405) which is called a thumbnail and is reduced to an icon is displayed in the defect candidate image display unit 1402 and the reference image display unit 1403. In addition, since a displayed image selection unit 1404 is used to select an image type which is displayed as the thumbnail image, an image captured from a desired detector can be displayed. A defect determination result with respect to a defect candidate image is displayed on a defect determination result display unit 1406. FIG. 14 shows an example in which a defect is present in the defect candidate image, and "no defect" or "false report" is displayed when no defect is present in the defect candidate image. Since a reference image ID selection unit 1407 is used to select an image to be displayed on the reference image display unit 1403 from one or more reference images used to determine the presence or absence of a defect in the defect candidate image, a reference image with a desired ID can be displayed.

In the first embodiment, based on the imaging visual field with respect to the chip coordinate of the defect candidate coordinate, defect candidate coordinates necessary for defect determination of a target defect candidate coordinate is calculated, a pseudo-reference image is generated based on the defect candidate images captured at the calculated defect candidate coordinates, and the presence or absence of a defect in the defect candidate image captured at the target defect candidate coordinate is determined.

The more the defect candidate coordinates are, the more likely regions with a similar circuit pattern are included in the imaging visual field regions of a defect candidate coordinate group, so that the pseudo-reference image can be generated from the defect candidate images captured at the defect candidate coordinates when there are a large number of the defect candidate coordinates.

When the pseudo-reference image can be generated, the presence or absence of a defect in the defect candidate image which is a defect determination target can be determined without capturing a reference image corresponding to a normal region formed with a pattern similar to that of the defect candidate image for each defect candidate image which is a defect determination target. As a result, the time of capturing a reference image for each defect candidate image can be shortened.

Second Embodiment

Next, the configuration of a defect observation device according to a second embodiment will be described.

The configuration of the defect observation device in the second embodiment is similar to the configuration of the device in the first embodiment (see FIG. 1), and the processing flow in the second embodiment is also similar to the processing flow in the first embodiment (see FIG. 3). The second embodiment is different from the first embodiment in a method of the processing S302 of calculating the defect determination coordinate group and the processing S2301 of generating the pseudo-reference image. Only parts different from the first embodiment will be described below.

A specific processing flow of the processing S302 of calculating the defect determination coordinate group will be described with reference to FIG. 15.

First, design information of a target semiconductor device is read from the design information storage unit 214 (S1501). Subsequent processing S1502 to S1506 is performed on each defect candidate coordinate. First, the design information read in S1501 is used to calculate an overlapping defect candidate coordinate which includes, in an imaging visual field, a circuit pattern which is partly similar to a circuit pattern in an imaging visual field of a target defect candidate coordinate (S1502). In S1502, the overlapping defect candidate coordinate may be calculated by using not only the design information but also a chip coordinate (a case where only the design information is used and the chip coordinate is not used will be described later).

FIG. 16 is a diagram showing information 1601 associated with defect candidate coordinate ID 1602 before processing of S1502 is performed, and chip ID 1607 with a defect candidate coordinate, chip coordinate 1603 at the upper left end of an imaging visual field region, chip coordinate 1604 at the lower right end of the imaging visual field region, overlapping defect candidate coordinate ID 1605, and defect determination coordinate group ID 1606 are associated with each defect candidate coordinate ID 1602.

FIG. 17 shows design information 1701 around a defect candidate coordinate with the defect candidate coordinate ID 1602 of 000101, circuit patterns 1702, an imaging visual field region 1703 with respect to a chip coordinate of the defect candidate coordinate with the defect candidate coordinate ID 1602 of 000101, imaging visual field regions 1704 with respect to chip coordinates of defect candidate coordinates with the defect candidate coordinate ID 1602 of 000102 to 000104, and an imaging visual field region 1705 with respect to a chip coordinate of a defect candidate coordinate with the defect candidate coordinate ID 1602 of 000105.

Since it is understood that the regions 1704 include a circuit pattern which is partly similar to a circuit pattern of the region 1703 by using the design information 1701, the defect candidate coordinates with the defect candidate coordinate ID 1602 of 000102 to 000104 are calculated as overlapping defect candidate coordinates of the defect candidate coordinate with the defect candidate coordinate ID 1602 of 000101.

FIG. 20 is a diagram showing information 2001 associated with defect candidate coordinate ID 2002 after overlapping defect candidate coordinates of a defect candidate coordinate with the defect candidate coordinate ID 2002 of 000101 are calculated, in which similar to FIG. 16, chip ID 2007 with a defect candidate coordinate, chip coordinate 2003 at the upper left end of an imaging visual field region, chip coordinate 2004 at the lower right end of the imaging visual field region, overlapping defect candidate coordinate ID 2005, and defect determination coordinate group ID 2006 are associated with each defect candidate coordinate ID 2002.

In the example of FIG. 20, defect candidate coordinates with the defect candidate coordinate ID of 000102, 0000103, 0000104, 000107, 000115, and 000118 are shown as overlapping defect candidate coordinates with respect to a defect candidate coordinate with the defect candidate coordinate ID 2002 of 000101.

Next, any combination which includes one or more overlapping defect candidate coordinates calculated in S1502 is generated (S1503). Subsequent processing S1504 to S506 is performed on each combination. First, based on a circuit pattern of a target defect candidate coordinate, imaging visual field regions of the overlapping defect candidate coordinates included in the combination are aligned to calculate a visual field region of a pseudo-reference image generated from images captured at the overlapping defect candidate coordinates, and a ratio (overlapping ratio) of an imaging visual field region of the target defect candidate coordinate overlapping the visual field region of the pseudo-reference image is calculated (S1504). Similar to the first embodiment, the visual field of the pseudo-reference image is referred to as an effective visual field.

FIG. 18 is a diagram showing relative imaging visual field regions 1803 to 1805 obtained by aligning imaging visual field regions of each of the defect candidate coordinates with the defect candidate coordinate ID of 000102 to 000104 based on an imaging visual field region 1802 and a circuit pattern 1801 of the target defect candidate coordinate with the defect candidate coordinate ID of 000101.

In S1504, an effective visual field region 1806 which overlaps at least one of the relative imaging visual field regions 1803 to 1805 is calculated and compared with the imaging visual field region 1802 with the defect candidate coordinate ID of 000101 (1807), and an occupying ratio of the effective visual field region 1806 with respect to an area of the imaging visual field region 1802 is calculated as an overlapping ratio.

Next, it is determined whether or not the overlapping ratio calculated in S1504 is equal to or greater than a threshold (S1505). If the overlapping ratio is equal to or greater than the threshold, it is determined that the target defect candidate coordinate can be checked by comparison, and a set of the overlapping defect candidate coordinates included in a target combination is extracted as a defect determination coordinate group (S1506).

FIG. 21 is a diagram showing information 2101 regarding a group after group 2 is extracted and regarding a defect candidate coordinate with the defect candidate coordinate ID of 000101, and in-group defect candidate coordinate ID 2103 is associated with each defect determination coordinate group ID 2102. In the example of FIG. 21, defect candidate coordinates with the defect candidate coordinate ID of 000102, 000103, and 000104 are included in a group with the group ID 2102 of G001001, and defect candidate coordinates with the defect candidate coordinate ID of 000107, 000115, and 0000118 are included in a group with the group ID 2102 of G001002.

Further, FIG. 22 is a diagram showing information 2201 associated with defect candidate coordinate ID 2202 after group 2 is extract and regarding a defect candidate coordinate with the defect candidate coordinate ID 2202 of 000101, in which similar to FIG. 16, chip ID 2207 with a defect candidate coordinate, chip coordinate 2203 at the upper left end of an imaging visual field region, chip coordinate 2204 at the lower right end of the imaging visual field region, overlapping defect candidate coordinate ID 2205, and defect determination coordinate group ID 2206 are associated with each defect candidate coordinate ID 2202. In the example of FIG. 22, a group with the group ID of G001001 and a group with the group ID of G001002 are calculated as defect determination coordinate groups with respect to the defect candidate coordinate with the defect candidate coordinate ID 2202 of 000101.

Here, a difference from the first embodiment with respect to the processing S2301 of generating a pseudo-reference image will be described. In the first embodiment, the pseudo-reference image is generated from defect candidate images captured at a plurality of defect candidate coordinates based on an imaging visual field with respect to a chip coordinate, while in the second embodiment, an image is composited by aligning a plurality of defect candidate images based on the design information, and a region including a circuit pattern similar to that of a defect determinable image is cut out to generate the pseudo-reference image.

That is, in the second embodiment, based on the design information of chips in a semiconductor wafer, defect candidate coordinates necessary for defect determination of a target defect candidate coordinate are calculated, a pseudo-reference image is generated from defect candidate images captured at the calculated defect candidate coordinates, and the presence or absence of a defect in the defect candidate image captured at the target defect candidate coordinate can be determined.

In the second embodiment, the more the defect candidate coordinates are, the more likely regions with a similar circuit pattern are included in the imaging visual field regions of a defect candidate coordinate group, so that the pseudo-reference image can be generated from the defect candidate images captured at the defect candidate coordinates when there are a large number of the defect candidate coordinates.

When the pseudo-reference image can be generated, the presence or absence of a defect in the defect candidate image which is a defect determination target can be determined without capturing a reference image corresponding to a normal region formed with a pattern similar to that of the defect candidate image for each defect candidate image which is a defect determination target. As a result, the time of capturing a reference image for each defect candidate image can be shortened.

REFERENCE SIGN LIST 101 scanning electron microscope
102 control unit
103 storage unit
104 processing unit
105 external storage medium input and output unit
106 user interface unit
107 network interface unit
108 sample wafer
110 electron source
111 detector
112 image generation unit
113 input and output terminal
211 defect determination defect candidate coordinate calculation unit
212 pseudo-reference image generation unit
213 defect determination unit

The invention claimed is:

1. A defect observation device, comprising:
a processor configured to determine coordinates of a plurality of second defect candidates as overlapping defect candidate coordinates, the plurality of second defect candidates respectively having, in a plurality of second imaging visual field regions overlapping a first imaging visual field region, a circuit pattern which partly overlaps a circuit pattern in the first imaging visual field region where a first defect candidate which is a defect determination target among a plurality of defect candidates of a sample is present,
wherein the processor is further configured to
generate a pseudo-reference image including a circuit pattern of the first defect candidate by superimposing a plurality of images respectively captured at the plurality of overlapping defect candidate coordinates;
compare
an image which is a defect determination target captured at coordinates of the first defect candidate with the pseudo-reference image to determine presence or absence of a defect in the image which is a defect determination target; and
determine coordinates of the plurality of second defect candidates as the overlapping defect candidate coordinates with reference to predetermined design information.

2. The defect observation device according to claim 1, wherein the processor is further configured to
calculate an overlapping ratio of an area of an comprehensive visual field region obtained by superimposing the plurality of second imaging visual field regions with respect to an area of the first imaging visual field region, and when the overlapping ratio is equal to or greater than a predetermined threshold, extracts coordinates of the plurality of second defect candidates present in the plurality of second imaging visual field regions as the overlapping defect candidate coordinates necessary for defect determination of the first defect candidate to create a defect determination coordinate group; and
generate the pseudo-reference image by superimposing a plurality of images respectively captured at the plurality of overlapping defect candidate coordinates that belong to the defect determination coordinate group.

3. The defect observation device according to claim 1, wherein
the processor compares the image which is a defect determination target with the pseudo-reference image to create a defect candidate detection result image, and determines that a defect is included in the image which is a defect determination target when the defect candidate is present in the defect candidate detection result image.

4. The defect observation device according to claim 1, wherein
the sample is a wafer having a plurality of chips, and
the processor determines coordinates of the defect candidates present in different chips as the overlapping defect candidate coordinates.

5. The defect observation device according to claim 1, wherein
the processor determines that a circuit pattern which partly overlaps the circuit pattern is included in the second imaging visual field regions with reference to the design information, and determines the coordinates of the plurality of second defect candidates as the overlapping defect candidate coordinates.

6. The defect observation device according to claim 5, wherein
the sample is a wafer having a plurality of chips, and the processor determines coordinates of the defect candidates present in the same chip as the overlapping defect candidate coordinates with reference to the design information.

7. A defect observation method, comprising:
determining coordinates of a plurality of second defect candidates as overlapping defect candidate coordinates, the plurality of second defect candidates respectively having, in a plurality of second imaging visual field regions overlapping a first imaging visual field region, a circuit pattern which partly overlaps a circuit pattern in the first imaging visual field region where a first defect candidate which is a defect determination target among a plurality of defect candidates of a sample is present;

generating a pseudo-reference image including a circuit pattern of the first defect candidate by superimposing a plurality of images respectively captured at the plurality of overlapping defect candidate coordinates; and comparing an image which is a defect determination target captured at coordinates of the first defect candidate with the pseudo-reference image to determine presence or absence of a defect in the image which is a defect determination target, wherein the sample is a wafer having a plurality of chips, and coordinates of the defect candidates present in the same chip are determined as the overlapping defect candidate coordinates with reference to predetermined design information.

8. The defect observation method according to claim 7, further comprising:

comparing and displaying the image which is a defect determination target and the pseudo-reference image, and displaying a result of determining the presence or absence of the defect in the image which is a defect determination target.

9. The defect observation method according to claim 7, wherein the sample is a wafer having a plurality of chips, and coordinates of the defect candidates present in different chips are determined as the overlapping defect candidate coordinates.

* * * * *